(12) United States Patent
Tsorng et al.

(10) Patent No.: US 10,925,166 B1
(45) Date of Patent: Feb. 16, 2021

(54) PROTECTION FIXTURE

(71) Applicant: Quanta Computer Inc., Taoyuan (TW)

(72) Inventors: Yaw-Tzorng Tsorng, Taoyuan (TW);
Chen-Chien Kuo, Taoyuan (TW);
Jui-Tang Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/723,804

(22) Filed: Dec. 20, 2019

Related U.S. Application Data

(60) Provisional application No. 62/883,912, filed on Aug. 7, 2019.

(51) Int. Cl.
| | | |
|---|---|---|
| H05K 1/02 | (2006.01) |
| H05K 1/11 | (2006.01) |
| H05K 1/14 | (2006.01) |
| H05K 1/18 | (2006.01) |
| H05K 5/00 | (2006.01) |
| H05K 5/02 | (2006.01) |
| H05K 7/00 | (2006.01) |
| H05K 7/02 | (2006.01) |
| H05K 7/14 | (2006.01) |
| H05K 7/18 | (2006.01) |
| H05K 7/20 | (2006.01) |
| H01R 12/00 | (2006.01) |

(52) U.S. Cl.
CPC ........... *H05K 1/181* (2013.01); *H05K 1/0278* (2013.01); *H05K 1/189* (2013.01)

(58) Field of Classification Search
CPC ... H05K 1/02; H05K 1/11; H05K 1/14; H05K 1/18; H05K 1/115; H05K 1/181; H05K 1/189; H05K 5/00; H05K 5/02; H05K 7/00; H05K 7/02; H05K 7/14; H05K 7/18; H05K 7/20; H01R 12/00; H01R 12/12; H01R 12/16
USPC ................ 361/748, 679.48, 749; 439/64, 92, 439/157.16, 326, 630, 924.1
See application file for complete search history.

(56) References Cited

U.S. PATENT DOCUMENTS

| | | | | |
|---|---|---|---|---|
| 4,412,712 A | * | 11/1983 | Reimer | H01R 12/7005 439/64 |
| 5,425,651 A | * | 6/1995 | Thrush | H01R 12/83 439/326 |
| 5,632,640 A | * | 5/1997 | Noda | H01R 12/7005 439/157 |

(Continued)

*Primary Examiner* — Xiaoliang Chen
(74) *Attorney, Agent, or Firm* — Nixon Peabody LLP

(57) ABSTRACT

A fixture and method are directed to releasably couple the fixture to a semi-flexible printed circuit board (PCB)/printed circuit board assembly (PCBA) at a flexible PCB/PCBA portion. The fixture includes a body with a first arm and a second arm extending from a base, an interior surface of the first arm facing an interior surface of the second arm. A first ridge extends from the interior surface of the first arm and defines a first gap between the first ridge and the interior surface of the second arm. The first gap is sized to receive and support a flexible PCB/PCBA portion. At least one second ridge extends from the interior surface of the first arm and defines a second gap between the at least one second ridge and the interior surface of the second arm. The second gap is sized to receive and support a rigid PCB/PCBA portion.

18 Claims, 5 Drawing Sheets

(56) References Cited

U.S. PATENT DOCUMENTS

| | | | | |
|---|---|---|---|---|
| 5,940,277 | A * | 8/1999 | Farnworth | H01L 23/32 |
| | | | | 174/260 |
| 10,789,189 | B1 * | 9/2020 | Balle | G06F 13/20 |
| 2010/0238634 | A1 * | 9/2010 | Matsuzawa | H05K 7/1461 |
| | | | | 361/748 |
| 2012/0064743 | A1 * | 3/2012 | Qin | H01R 13/6471 |
| | | | | 439/92 |
| 2012/0081862 | A1 * | 4/2012 | Lin | H05K 7/142 |
| | | | | 361/748 |
| 2012/0275121 | A1 * | 11/2012 | Hauenstein | H01L 25/072 |
| | | | | 361/748 |
| 2012/0281372 | A1 * | 11/2012 | Maruta | H05K 7/1418 |
| | | | | 361/752 |
| 2012/0320538 | A1 * | 12/2012 | Wu | G06F 1/185 |
| | | | | 361/748 |
| 2017/0147852 | A1 * | 5/2017 | Benkley, III | H01L 23/5387 |
| 2018/0027700 | A1 * | 1/2018 | Adiletta | G06F 3/0655 |
| | | | | 361/679.48 |
| 2019/0034383 | A1 * | 1/2019 | Schmisseur | G06F 16/2255 |
| 2019/0062053 | A1 * | 2/2019 | Jensen | G06F 11/3409 |
| 2019/0065253 | A1 * | 2/2019 | Bernat | G06F 9/4887 |
| 2019/0141845 | A1 * | 5/2019 | Prakash | H05K 7/1492 |
| 2019/0150276 | A1 * | 5/2019 | Naohara | H01H 50/02 |
| | | | | 361/749 |
| 2019/0173211 | A1 * | 6/2019 | Aoki | H01R 12/721 |
| 2019/0253518 | A1 * | 8/2019 | Nachimuthu | H04L 43/0817 |
| 2019/0278676 | A1 * | 9/2019 | Zou | G06F 3/067 |
| 2019/0319385 | A1 * | 10/2019 | Ying | H01R 31/06 |
| 2019/0324802 | A1 * | 10/2019 | Reddy | G06F 9/4881 |
| 2019/0324811 | A1 * | 10/2019 | Ganguli | H04L 41/0813 |
| 2020/0007511 | A1 * | 1/2020 | Van de Groenendaal | |
| | | | | G06F 21/64 |
| 2020/0065271 | A1 * | 2/2020 | Adiletta | G06F 13/20 |

* cited by examiner

PROTECTION FIXTURE

CROSS-REFERENCE TO RELATED APPLICATION

This application claims priority under 35 U.S.C. § 119 to U.S. Provisional Application No. 62/883,912, titled "SEMI FLEX PCBA PROTECTION FIXTURE FOR HANDLING AND TRANSPORTATION," and filed on Aug. 7, 2019. The contents of that application are hereby incorporated by reference in their entirety.

FIELD OF THE INVENTION

The present invention relates to fixtures for protecting printed circuit boards (PCBs), including printed circuit board assemblies (PCBAs). More specifically, the present invention relates to fixtures that protect PCBs and PCBAs with semi-flexible portions during handling and transportation. These fixtures are also referred to as semi-flexible PCBs and semi-flexible PCBAs.

BACKGROUND

Typically, semi-flexible PCBAs include two different portions, each with different rigidities. For example, one portion is a rigid PCBA portion with the standard rigidity for a PCBA. The other portion is a flexible PCBA portion with a lower rigidity than that of the PCBA portion with standard rigidity.

FIGS. 1A and 1B illustrate a schematic plan view and a schematic side view, respectively, of a semi-flexible PCBA 100 with multiple rigid PCBA portions 102, and a flexible PCBA portion 104. The flexible PCBA portion 104 is easier to damage during operator handling and transportation, as compared to the rigid PCBA portions 102. However, it is important to still include the flexible PCBA portion 104. For example, although the flexible PCBA portion 104 may be co-planar with the rigid PCBA portion 102 during transportation, the flexible PCBA portion 104 allows the semi-flexible PCBAs 100 to take various non-planar shapes, such as when the semi-flexible PCBAs 100 are installed in computer housings.

Accordingly, there is a need for protecting the flexible PCBA portion 104, particularly during the handing and transportation of the semi-flexible PCBA 100. Aspects of the present disclosure solve this and other problems.

SUMMARY

According to one embodiment, a fixture for a PCBA includes a body having a first arm and a second arm extending from a base. An interior surface of the first arm faces an interior surface of the second arm. The fixture also includes a first ridge extending from the interior surface of the first arm. The first ridge defines a first gap between the first ridge and the interior surface of the second arm. The first gap is sized to receive and support a flexible PCB portion of the PCBA. The fixture further includes at least one second ridge extending from the interior surface of the first arm. The at least one second ridge defines a second gap between the at least one second ridge and the interior surface of the second arm. The second gap is sized to receive and support a rigid PCB portion of the PCBA.

A further aspect of the embodiment includes the first ridge having an angled front portion for urging the flexible PCB portion towards the interior surface of the second arm. Another aspect of the embodiment includes the at least one second ridge having an angled front portion for urging the rigid PCB portion towards the interior surface of the second arm. Still another aspect includes the second arm having an angled front portion for urging the flexible PCB portion towards the first ridge and the rigid PCB portion towards the at least one second ridge. Yet another aspect includes a width of the first ridge being substantially equal to a width of the flexible PCB portion. Another aspect of the embodiment includes the at least one second ridge being two second ridges. The two second ridges are on opposite sides of the first ridge, in one implementation. The two second ridges have angled front portions, in another implementation. In yet another aspect, the first ridge is integral with the body. In another aspect, alternatively, the at least one second ridge is integral with the body. In accordance with yet another aspect, the first ridge and the at least one second ridge are both integral with the body. In yet another aspect, the first ridge extends from the base to a distal end of the first arm. In yet another aspect, the at least one second ridge extends from the base to a location between the base and a distal end of the first arm.

According to another embodiment, a PCBA includes two rigid PCBA portions, a flexible PCBA portion, and at least one fixture. The flexible PCBA portion is located between and couples together the two rigid PCBA portions. The at least one fixture is removably coupled to the flexible PCBA portion and is configured to substantially prevent the flexible PCBA portion from flexing.

According to further aspects of this embodiment, the at least one fixture includes a first fixture and a second fixture. The first fixture is coupled to a first end of the flexible PCBA portion. The second fixture is coupled to a second end of the flexible PCBA portion, the second end being opposite from the first end. In another aspect, the at least one fixture includes a body, a first ridge, and at least one second ridge. The body has a first arm and a second arm extending from a base. An interior surface of the first arm faces an interior surface of the second arm. The first ridge extends from the interior surface of the first arm and defines a first gap between the first ridge and the interior surface of the second arm. The first gap is sized to receive and support the flexible PCBA portion. The at least one second ridge extends from the interior surface of the first arm and defines a second gap between the at least one second ridge and the interior surface of the second arm. The second gap is sized to receive and support one of the two rigid PCBA portions. According to one aspect, a width of the first ridge is substantially equal to a width of the flexible PCBA portion.

According to yet another embodiment, a PCB includes two rigid PCB portions, a flexible PCB portion, and at least one fixture. The flexible PCB portion is located between and couples together the two rigid PCB portions. The at least one fixture is removably coupled to the flexible PCB portion and is configured to substantially prevent the flexible PCB portion from flexing.

According to one aspect of the embodiment, the at least one fixture includes a first fixture and a second fixture. The first fixture is coupled to a first end of the flexible PCB portion, and the second fixture is coupled to a second end of the flexible PCB portion, the second end being opposite from the first end. In another aspect, the at least one fixture includes a body, a first ridge, and at least one second ridge. The body has a first arm and a second arm extending from a base. An interior surface of the first arm faces an interior surface of the second arm. The first ridge extends from the interior surface of the first arm and defines a first gap between the first ridge and the interior surface of the second arm. The first gap is sized to receive and support a flexible PCB portion. The at least one second ridge extends from the interior surface of the first arm and defines a second gap between the at least one second ridge and the interior surface of the second arm. The second gap is sized to receive and support one of the two rigid PCB portions.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of embodiments together with reference to the accompanying drawings. These drawings depict only embodiments and are, therefore, not to be considered as limitations on the scope of the various embodiments or claims.

DETAILED DESCRIPTION

Figure 1A:
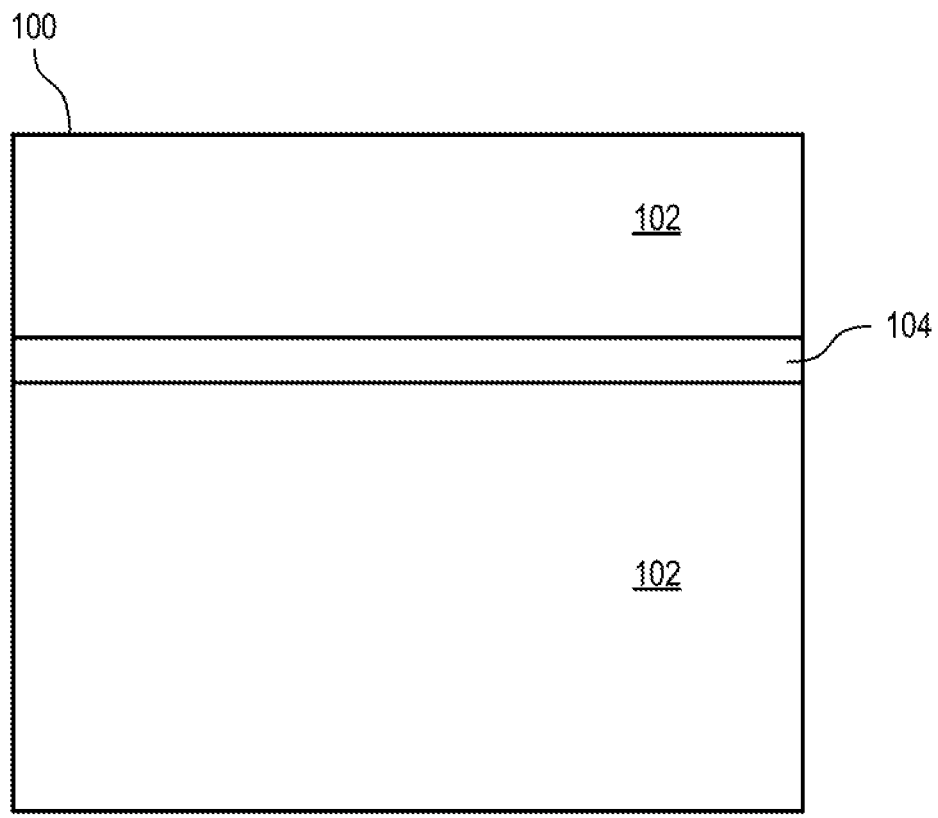
FIG. 1A is a plan view depicting a semi-flexible PCBA.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

As discussed above, there is a need to stiffen flexible PCBA portions. Thus, in accordance with some aspects, the present disclosure is directed to a fixture that couples to a semi-flexible PCBA at the flexible PCBA portions. The fixture releasably couples to the semi-flexible PCBA to stiffen the flexible PCBA portion, which prevents or minimizes damage to the flexible PCBA portion, such as during handling and transportation. The fixture allows for PCBAs to still have flexible PCBA portions for the benefit of reduced transportation fees, as example, while still preventing or minimizing damage.

Figure 2A:
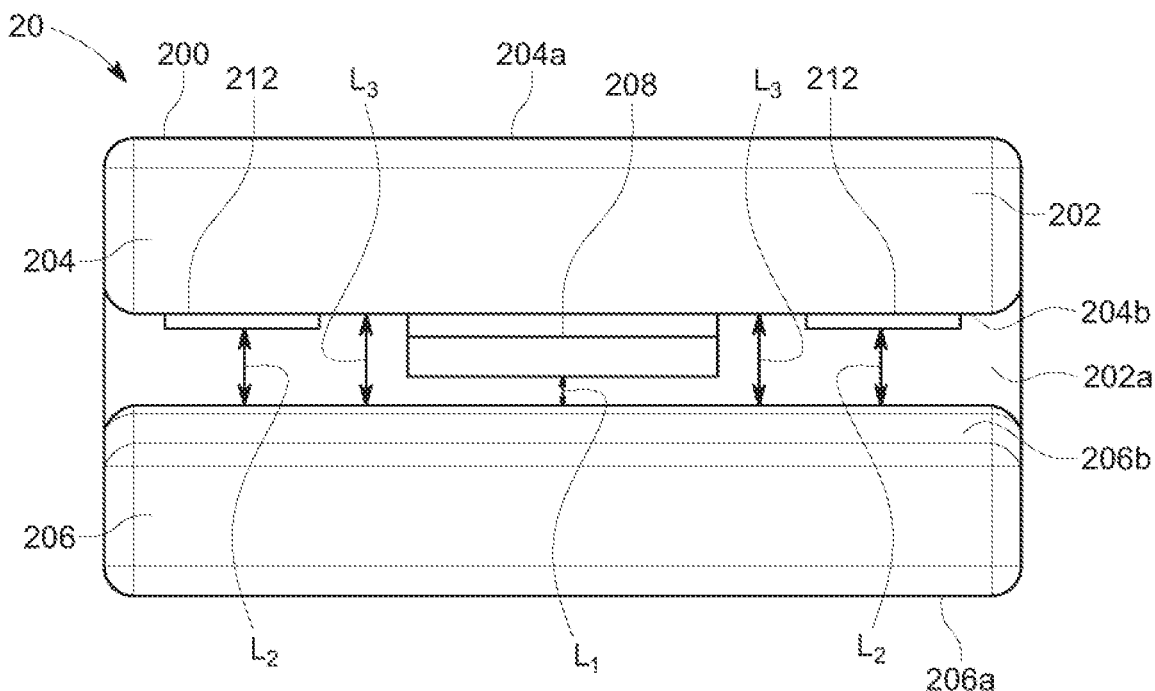
FIG. 2A is a front view depicting a fixture for stiffening a flexible PCBA portion, according to certain aspects of the present disclosure.
Figure 2B:
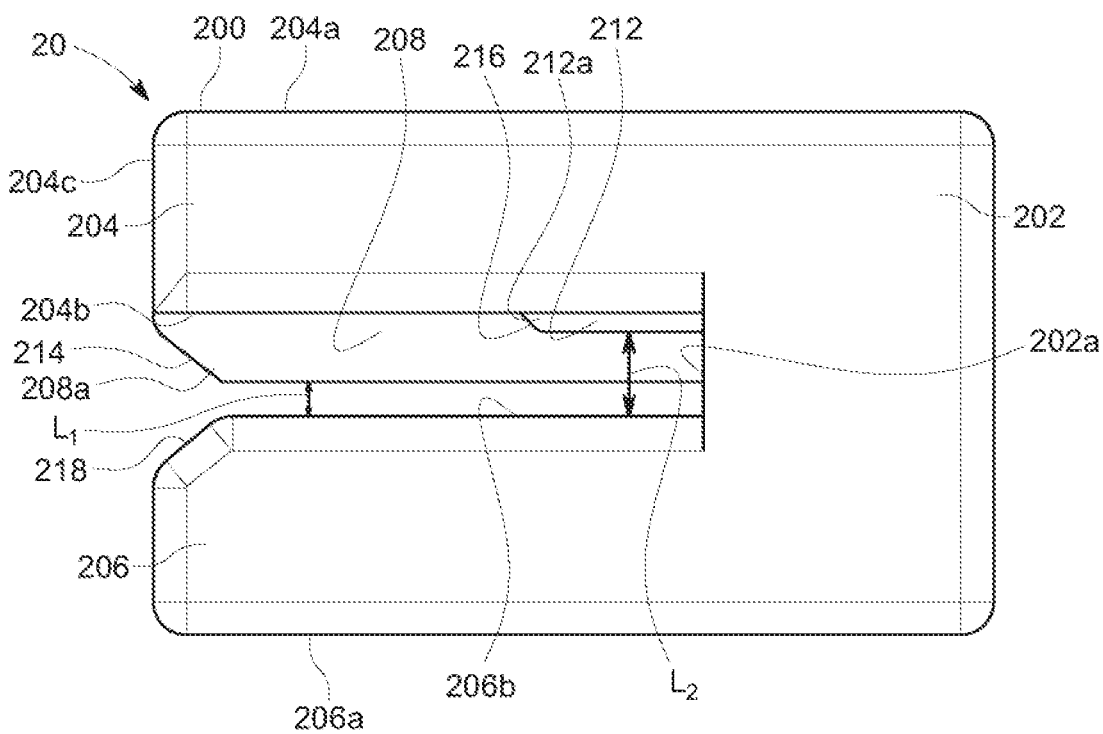
FIG. 2B is a side view depicting the fixture of FIG. 2A, according to certain aspects of the present disclosure.

Referring to FIGS. 2A and 2B, illustrated are a front view and a side view, respectively, depicting a fixture 20 for stiffening a flexible PCBA portion, according to certain aspects of the present disclosure. The fixture 20 includes a body 200 having a first arm 204 and a second arm 206 that both extend from an interior surface 202a of a base 202. The first arm 204 has an exterior surface 204a and an interior surface 204b. Similarly, the second arm 206 has an exterior surface 206a and an interior surface 206b. The interior surface 204b of the first arm 204 faces the interior surface 206b of the second arm 206. The interior surface 204b and the interior surface 206b define a gap $L_3$ within which a semi-flexible PCB is inserted, as discussed further below.

Figure 1B:
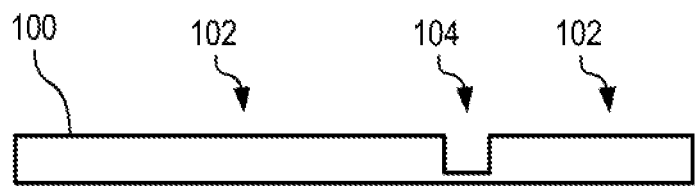
FIG. 1B is a side view depicting the semi-flexible PCBA of FIG. 1A.

The base 202, the first arm 204, and the second arm 206 are generally planar and rectangular in shape. Alternatively, one or more of the base 202, the first arm 204, and the second arm 206 is a shape other than rectangular—such as triangular, square, semi-circular, etc.—without departing from the present disclosure. Additionally, the exterior surfaces 204a and 206a of the first arm 204 and second arm 206, respectively, are non-planar, without departing from the disclosure. However, it is preferable, in accordance with one implementation of the present disclosure, that the interior surfaces 204b and 206b of the first arm 204 and the second arm 206, respectively, are planar to stiffen the flexible PCB and PCBA portions when the flexible PCB and PCBA portions discussed above are co-planar with adjacent rigid PCB and PCBA portions (FIG. 1).

The fixture 20 further includes a first ridge 208, also referred to as a primary ridge 208, extending from the interior surface 204b of the first arm 204. The primary ridge 208 defines a first gap $L_1$ between the primary ridge 208 and the interior surface 206b of the second arm 206. As discussed further below with respect to FIGS. 3A and 3B, the first gap $L_1$ is sized to receive and support a flexible PCBA portion.

The dimensions of the primary ridge 208 vary depending on the dimensions of the corresponding flexible PCBA portion. For example, in one or more embodiments, the width of the primary ridge 208 is substantially equal to the width of the corresponding flexible PCBA portion. Alternatively, in one or more embodiments, the width of the primary ridge 208 is narrower than the width of the corresponding flexible PCBA portion. Further, and as shown in FIG. 2B, the primary ridge 208 extends from the base 202 to a distal end 204c of the first arm 204. Alternatively, the primary ridge 208 extends from the base 202 to any point proximal to the distal end 204c of the first arm 204.

Referring to FIG. 2A, the fixture 20 further includes two secondary ridges 212 extending from the interior surface 204b of the first arm 204. One of the two secondary ridges 212 is on an opposite side of the primary ridge 208 from the other of the two secondary ridges 212. Each secondary ridge 212 defines a second gap $L_2$ between the respective secondary ridge 212 and the interior surface 206b of the second arm 206. As discussed further below with respect to FIGS. 3A and 3B, the second gaps $L_2$ are sized to receive and support a rigid PCB portion. Although the second gaps $L_2$ appear larger than the first gap $L_1$ in FIGS. 2A and 2B, in one or more embodiments, the second gaps $L_2$ can be the same size as the first gap $L_1$ or smaller, depending on the thicknesses of the corresponding flexible and rigid PCB portions.

In accordance with other implementations of the present disclosure, although two secondary ridges 212 are disclosed and shown in FIG. 2A, the fixture 20 optionally or alternatively has one or more than two secondary ridges 212. All of the secondary ridges 212 extend from the interior surface 204b of the first arm 204. Alternatively, any number of the secondary ridges 212, or all of the secondary ridges 212, extend from the interior surface 206b of the second arm 206, depending on the configuration of the corresponding semi-flexible PCB for which the fixture 20 is configured to stiffen. Further, in one or more embodiments, the fixture 20 instead includes no secondary ridge 212, in which case the interior surface 204b of the first arm 204 (or the interior surface 206b of the second arm 206), instead engages the rigid PCB portions.

The secondary ridges 212 extend from the base 202 to any location between the base 202 and the distal end 204c of the first arm 204. As shown in FIG. 2B, the distal end 212a of the secondary ridge 212 is proximal to the distal end 204c of the first arm 204, and also proximal to the distal end 208a of the primary ridge 208. Accordingly, the distal ends 212a of the secondary ridges 212 are staggered with the distal end 208a of the primary ridge 208.

Referring to FIG. 2B, in one or more embodiments, the primary ridge 208 includes an angled front portion 214. The angled front portion 214 helps urge a flexible PCB portion towards the interior surface 206b of the second arm 206 when sliding the fixture 20 onto a semi-flexible PCBA, as discussed below with respect to FIGS. 3A and 3B. In one or more embodiments, the angled front portion 214 is beveled, chamfered, or has any other geometry (besides a flat front) that aids in releasably coupling the fixture 20 to the flexible PCB portion. Optionally, the primary ridge 208 has a flat front (i.e., not the angled front portion 214).

Similarly, in one or more embodiments, each of the secondary ridges 212 includes angled front portions 216. The angled front portions 216 help urge a rigid PCB portion towards the interior surface 206b of the second arm 206 when sliding the fixture 20 onto a semi-flexible PCBA, as discussed below with respect to FIGS. 3A and 3B. In one or more embodiments, the angled front portion 216 is beveled, chamfered, or has any other geometry besides a flat front that aids in releasably coupling the fixture 20 to the rigid PCB portion. The angled front portions 216 have the same geometry or have one or more different geometries. Optionally, the secondary ridges 212 have flat fronts (i.e., not the angled front portions 216).

In one or more embodiments, the second arm 206 has an angled front portion 218 for urging the semi-flexible PCB, or either one or both of the flexible and rigid PCB portions, towards the primary ridge 208 and the secondary ridges 212. In one or more embodiments, the angled front portions 218 are beveled, chamfered, or have any other geometry besides a flat front that aids in urging the semi-flexible PCB. Optionally, the second arm 206 has a flat front (i.e., not the angled front portion 218).

The fixture 20 is made of a material that has a higher rigidity than the rigidity of the flexible PCBA portions 104 discussed above (FIG. 1). For example, the fixture 20 is formed from one or more plastics, one or more rubbers, one or more metals, one or more alloys, or combinations thereof. For example, the base 202, the first arm 204, and the second arm 206 are formed from a metal, such as one monolithic piece of metal, in which case the base 202, the first arm 204, and the second arm 206 are integral with each other. The primary ridge 208 and the secondary ridges 212 are formed from a plastic or rubber material that is affixed or otherwise attached to the first arm 204, but not integral with the first arm 204. Alternatively, the primary ridge 208, the secondary ridges 212, or both are formed from the same monolithic piece as the base 202, the first arm 204, and the second arm 206.

In one or more embodiments, the fixture 20 is formed, at least in part, from an electrically insulating material. For example, the fixture 20 is formed entirely from one or more electrically insulating plastic or rubber materials. In another example, the fixture 20 is formed from a metal material coated with an electrically insulating plastic or rubber material, such that the plastic or rubber material is inn contact with the semi-flexible PCB and the metal makes the fixture 20 rigid.

Figure 3A:
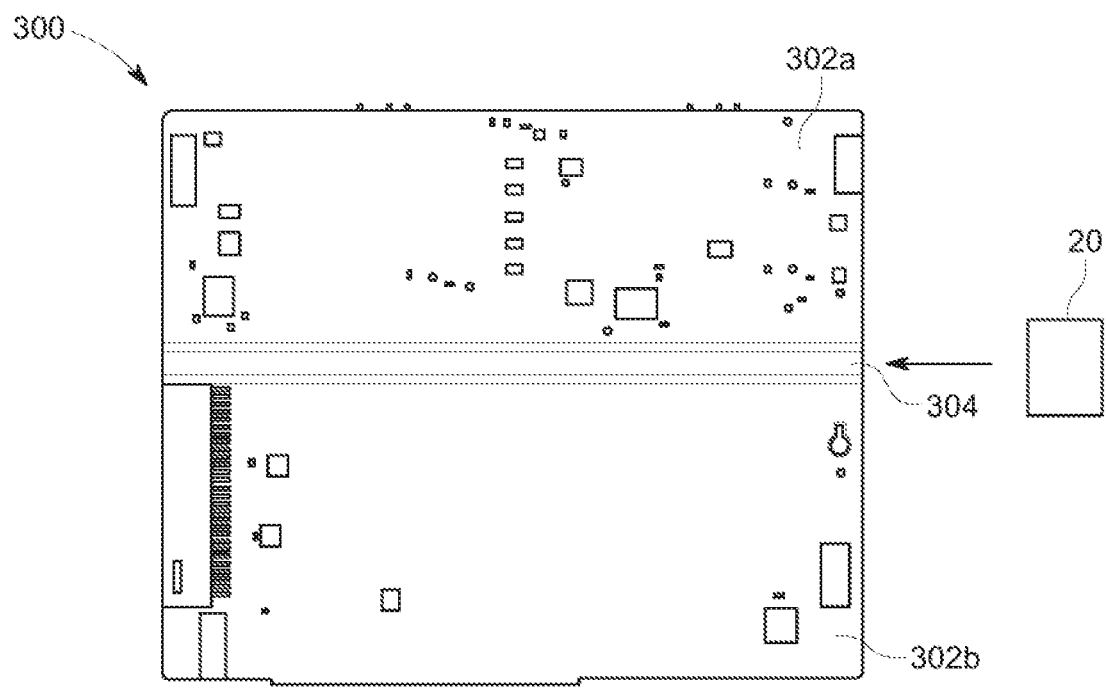
FIG. 3A is a plan view depicting a process step for installing a fixture onto a flexible PCBA portion, according to certain aspects of the present disclosure.
Figure 3B:
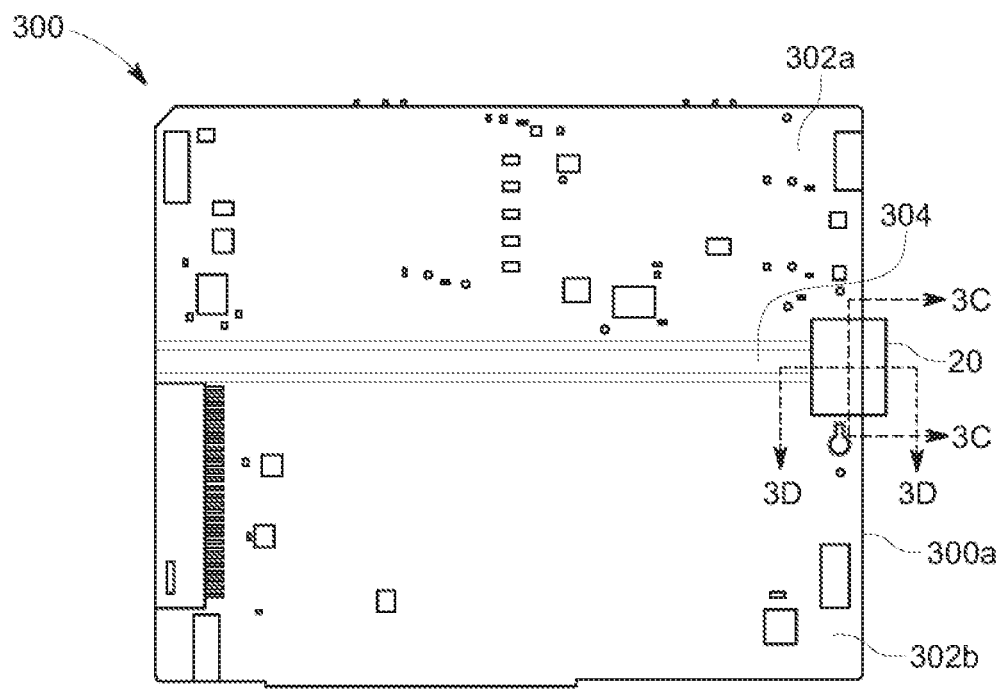
FIG. 3B is a plan view depicting a fixture installed onto a flexible PCBA portion after the process step of FIG. 3A, according to certain aspects of the present disclosure.
Figure 3C:
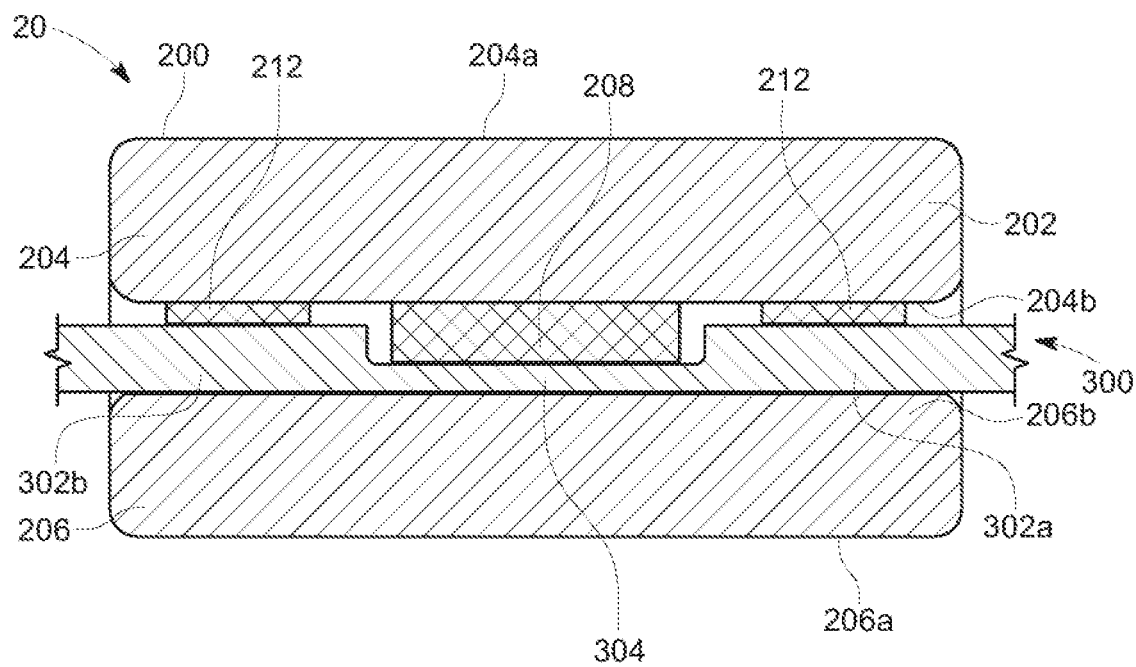
FIG. 3C illustrates a cross-sectional view of the fixture of FIGS. 3A and 3B fully engaged with the semi-flexible PCBA through the line 3C-3C in FIG. 3B, according to certain aspects of the present disclosure.

Referring to FIGS. 3A-3C, a process is directed to installing a fixture, such as the fixture 20 of FIGS. 2A and 2B, onto a semi-flexible PCBA, according to certain aspects of the present disclosure. More specifically, FIG. 3A is a plan view depicting a process step for installing the fixture 20 onto a semi-flexible PCBA 300, according to certain aspects of the present disclosure. FIG. 3B is a plan view depicting the fixture 20 installed on the semi-flexible PCBA 300, after the process step of FIG. 3A, according to certain aspects of the present disclosure.

Referring to FIG. 3A, the semi-flexible PCBA 300 includes two rigid PCBA portions 302a and 302b connected by a flexible PCBA portion 304. As discussed above with respect to the semi-flexible PCBA 100 of FIGS. 1A and 1B, the flexible PCBA portion 304 allows the semi-flexible PCBA 300 to be planar during shipment, but then conform to a non-planar configuration when installed in, for example, a computer housing.

The fixture 20 is brought to the semi-flexible PCBA 300 such that the primary ridge 208 is aligned with the flexible PCBA portion 304. The fixture 20 is further moved to engage the semi-flexible PCBA 300, such that the primary ridge 208 engages the flexible PCBA portion 304, and the secondary ridges 212 engage the rigid PCBA portions 302a and 302b. The fixture 20 is further moved until the edge 300a of the semi-flexible PCBA 300 abuts the interior surface 202a of the base 202.

Figure 3D:
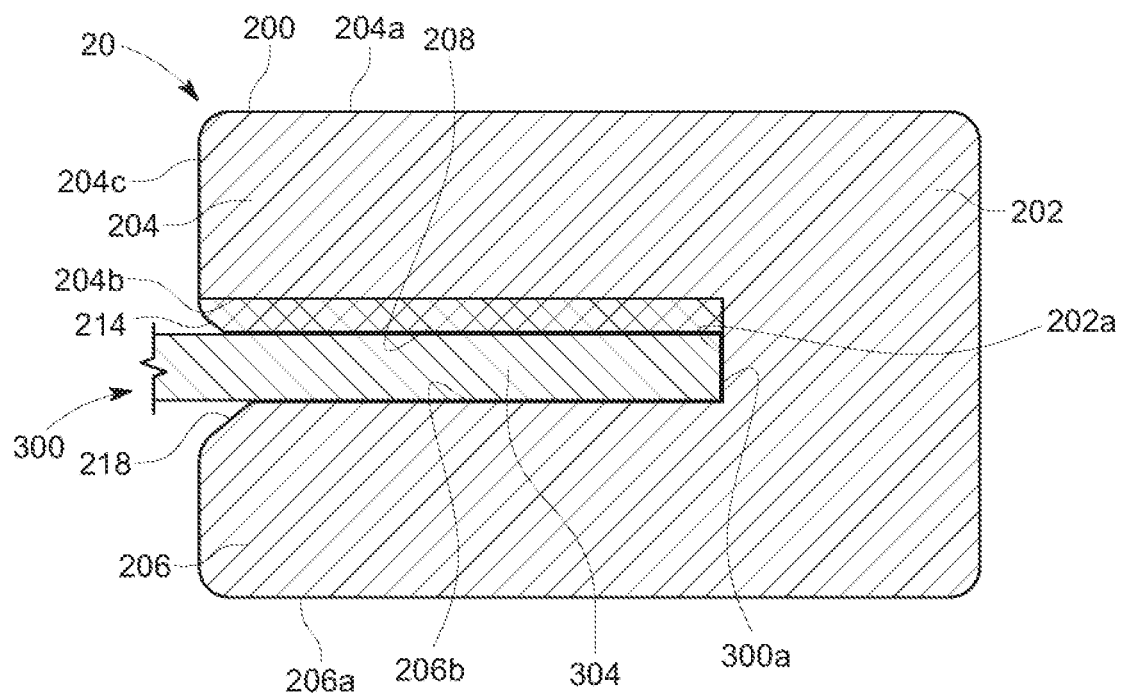
FIG. 3D illustrates a cross-sectional view of the fixture of FIGS. 3A and 3B fully engaged with the semi-flexible PCBA through the line 3D-3D in FIG. 3B, according to certain aspects of the present disclosure

FIG. 3C illustrates a cross-sectional view of the fixture 20 fully engaged with the semi-flexible PCBA 300 through the line 3C-3C in FIG. 3B, according to certain aspects of the present disclosure. FIG. 3D illustrates a cross-sectional view of the fixture 20 fully engaged with the semi-flexible PCBA 300 through the line 3D-3D in FIG. 3B, according to certain aspects of the present disclosure. As illustrated in FIG. 3C, the primary ridge 208 is seated against the flexible PCBA portion 304, and the secondary ridges 212 are seated against the rigid PCBA portions 302a and 302b. The width of the primary ridge 208 is generally the same width as the flexible PCBA portion 304. This assists in, and is beneficial for, preventing or inhibiting any portion of the flexible PCBA portion 304 from flexing during handling and transportation. As illustrated in FIG. 3D, the fixture 20 is fully engaged with the semi-flexible PCBA 300, based on the edge 300a of the semi-flexible PCBA 300 abutting the interior surface 202a of the base 202.

Figure 4:
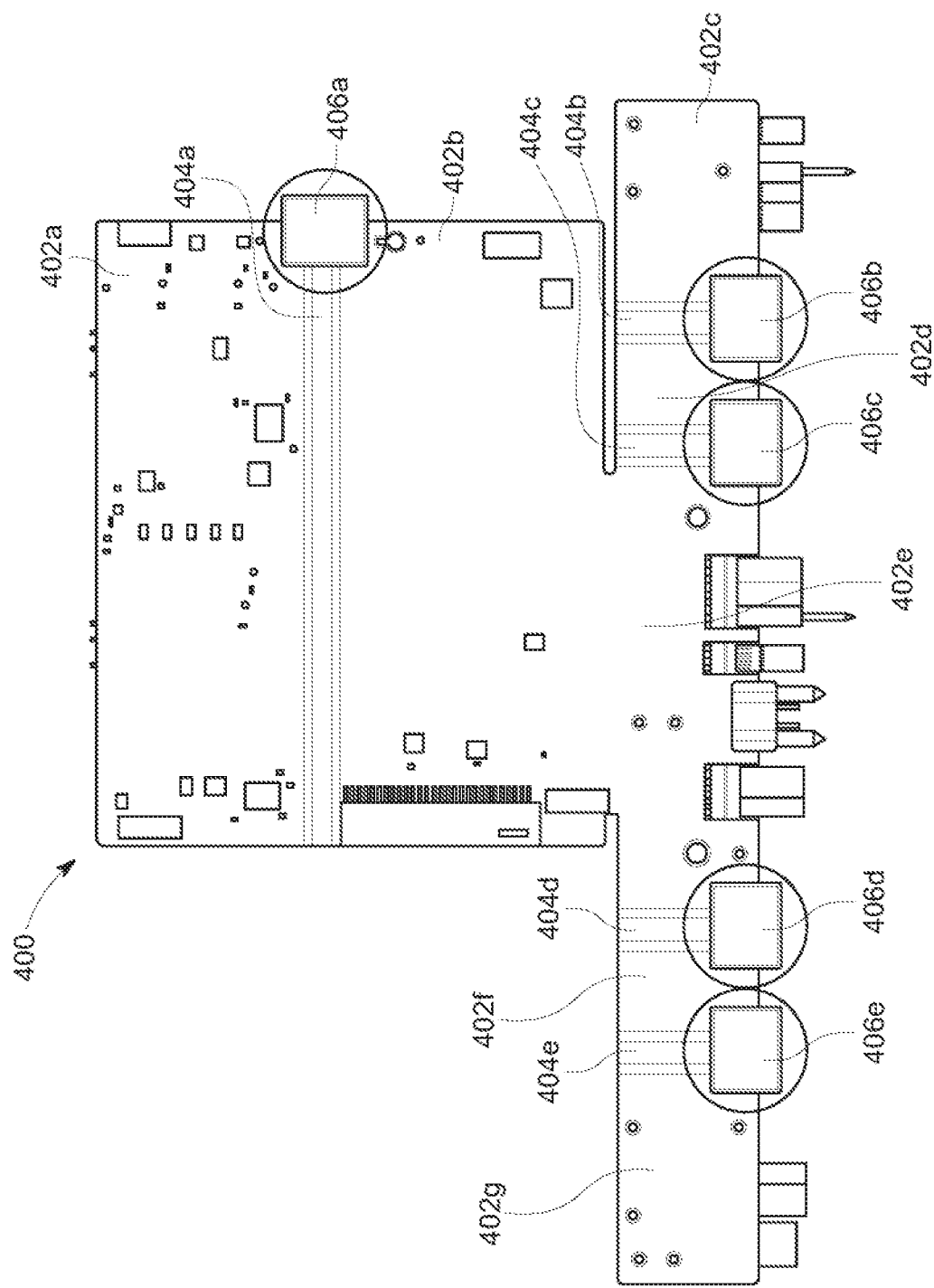
FIG. 4 is a plan view depicting a PCBA with multiple fixtures reinforcing multiple flexible PCBA portions, according to certain aspects of the present disclosure.

FIG. 4 is a plan view depicting a semi-flexible PCBA 400 with multiple fixtures 406a-406e reinforcing multiple flexible PCBA portions 404a-404e, according to certain aspects of the present disclosure. Specifically, the semi-flexible PCBA 400 includes multiple rigid PCBA portions 402a-402g. Adjacent ones of the rigid PCBA portions 402a-402g are connected by one of the flexible PCBA portions 404a-404e. To releasably increase the rigidity of the semi-flexible PCBA 400, such as during transportation, each one of the fixtures 406a-406e is releasably coupled to the semi-flexible PCBA 400 at the flexible PCBA portions 404a-404e. After transportation, handling, or both are completed, the fixtures 406a-406e are removed so that the flexible PCBA portions 404a-404e can flex, which allows the semi-flexible PCBA 400 to take the required shape within, for example, a computer housing.

Although FIG. 4 illustrates a one-to-one relationship between the flexible PCBA portions 404a-404e and the fixtures 406a-406e, in one or more embodiments, each flexible PCBA portion 404a-404e has pairs of fixtures, such as one fixture at each exposed end of each flexible PCBA portion 404a-404e. This arrangement further beneficially increases the rigidity of the flexible PCBA portions 404a-404e during transportation and/or handling.

Although reference is made throughout the present disclosure to PCB or PCBA, the fixture of the present disclosure is equally applicable to both PCBs and PCBAs. Thus, the fixtures of the present disclosure protect the flexible PCB portions prior to further components being added to the PCBs for forming the PCBAs, such that reference in this disclosure to PCB and PCBA is intended to be interchangeable.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A fixture for a printed circuit board assembly, the fixture comprising:
   a body having a first arm and a second arm extending from a base, an interior surface of the first arm facing an interior surface of the second arm;
   a first ridge extending from the interior surface of the first arm and defining a first gap between the first ridge and the interior surface of the second arm, the first gap being sized to receive and support a flexible printed circuit board portion of the printed circuit board assembly; and
   at least one second ridge extending from the interior surface of the first arm and defining a second gap between the at least one second ridge and the interior surface of the second arm, the second gap being sized to receive and support a rigid printed circuit board portion of the printed circuit board assembly.

2. The fixture of claim 1, wherein the first ridge has an angled front portion for urging the flexible printed circuit board portion towards the interior surface of the second arm.

3. The fixture of claim 1, wherein the at least one second ridge has an angled front portion for urging the rigid printed circuit board portion towards the interior surface of the second arm.

4. The fixture of claim 1, wherein the second arm has an angled front portion for urging the flexible printed circuit board portion towards the first ridge and the rigid printed circuit board portion towards the at least one second ridge.

5. The fixture of claim 1, wherein a width of the first ridge is substantially equal to a width of the flexible printed circuit board portion.

6. The fixture of claim 1, wherein the at least one second ridge includes two second ridges.

7. The fixture of claim 6, wherein the two second ridges are on opposite sides of the first ridge.

8. The fixture of claim 6, wherein each of the two second ridges has an angled front portion.

9. The fixture of claim 1, wherein the first ridge is integral with the body.

10. The fixture of claim 1, wherein the at least one second ridge is integral with the body.

11. The fixture of claim 1, wherein the first ridge and the at least one second ridge are integral with the body.

12. The fixture of claim 1, wherein the first ridge extends from the base to a distal end of the first arm.

13. The fixture of claim 12, wherein the at least one second ridge extends from the base to a location between the base and a distal end of the first arm.

14. A printed circuit board assembly comprising:
two rigid printed circuit board assembly portions;
a flexible printed circuit board assembly portion located between and coupling together the two rigid printed circuit board assembly portions; and
at least one fixture removably coupled to the flexible printed circuit board assembly portion and configured to substantially prevent the flexible printed circuit board assembly portion from flexing, the at least one fixture comprises:
a body having a first arm and a second arm extending from a base, wherein an interior surface of the first arm faces an interior surface of the second arm;
a first ridge extending from the interior surface of the first arm and defining a first gap between the first ridge and the interior surface of the second arm, the first gap being sized to receive and support the flexible printed circuit board assembly portion; and
at least one second ridge extending from the interior surface of the first arm and defining a second gap between the at least one second ridge and the interior surface of the second arm, the second gap being sized to receive and support one of the two rigid printed circuit board assembly portions.

15. The printed circuit board assembly of claim 14, wherein the at least one fixture includes a first fixture and a second fixture, the first fixture being coupled to a first end of the flexible printed circuit board assembly portion and the second fixture being coupled to a second end of the flexible printed circuit board assembly portion, the second end being opposite from the first end.

16. The printed circuit board assembly of claim 14, wherein a width of the first ridge is substantially equal to a width of the flexible printed circuit board assembly portion.

17. A printed circuit board comprising:
two rigid printed circuit board portions;
a flexible printed circuit board portion located between and coupling together the two rigid printed circuit board portions; and
at least one fixture removably coupled to the flexible printed circuit board portion and configured to substantially prevent the flexible printed circuit board portion from flexing, the at least one fixture includes:
a body having a first arm and a second arm extending from a base, an interior surface of the first arm facing an interior surface of the second arm;
a first ridge extending from the interior surface of the first arm and defining a first gap between the first ridge and the interior surface of the second arm, the first gap being sized to receive and support a flexible printed circuit board portion; and
at least one second ridge extending from the interior surface of the first arm and defining a second gap between the at least one second ridge and the interior surface of the second arm, the second gap being sized to receive and support one of the two rigid printed circuit board portions.

18. The printed circuit board of claim 17, wherein the at least one fixture includes a first fixture and a second fixture, the first fixture being coupled to a first end of the flexible printed circuit board portion and the second fixture being coupled to a second end of the flexible printed circuit board portion, the second end being opposite from the first end.

* * * * *